United States Patent
Liu et al.

(10) Patent No.: US 12,543,579 B2
(45) Date of Patent: Feb. 3, 2026

(54) DUAL SIDE COOLED POWER MODULE WITH THREE-DIMENSIONAL DIRECT BONDED METAL SUBSTRATES

(71) Applicant: SEMICONDUCTOR COMPONENTS INDUSTRIES, LLC, Phoenix, AZ (US)

(72) Inventors: Yong Liu, Cumberland Foreside, ME (US); Yusheng Lin, Phoenix, AZ (US); Jerome Teysseyre, Scottsdale, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 592 days.

(21) Appl. No.: 17/813,380

(22) Filed: Jul. 19, 2022

(65) Prior Publication Data

US 2024/0030122 A1    Jan. 25, 2024

(51) Int. Cl.
*H01L 23/498* (2006.01)
*H01L 23/00* (2006.01)
(Continued)

(52) U.S. Cl.
CPC ...... *H01L 23/49838* (2013.01); *H01L 23/367* (2013.01); *H01L 24/29* (2013.01);
(Continued)

(58) Field of Classification Search
CPC . H01L 23/49838; H01L 23/367; H01L 24/29; H01L 24/30; H01L 24/32; H01L 24/33; H01L 23/3735; H01L 25/072; H01L 25/18; H01L 2224/29111; H01L 2224/2912; H01L 2224/29139; H01L 2224/29147; H01L 2224/30505; H01L 2224/32227; H01L 2224/32238; H01L 2224/33181; H01L 2924/0132;
(Continued)

(56) References Cited

U.S. PATENT DOCUMENTS 9,655,294 B2 * 5/2017 Loong ...................... B21J 5/068
2005/0073042 A1 4/2005 Hirano et al.
(Continued)

OTHER PUBLICATIONS

"Double Side Cooled 700V 400A Igbt Module", Power Semiconductor Report by Elena Barbarini, https://s3.i-micronews.com/uploads/2019/02/Yole_SP18375_Infineon_double_side_cooling_IGBT_sample.pdf), 40 pages.

*Primary Examiner* — Norman D Richards
*Assistant Examiner* — Sammantha K Salaz
(74) *Attorney, Agent, or Firm* — Brake Hughes Bellermann LLP

(57) ABSTRACT

A substrate includes a ceramic tile and a three-dimensional (3D) conductive structure. The 3D conductive structure includes a planar base layer having a bottom surface bonded to a top surface of the ceramic tile, and a block disposed above the planar base layer. The block is monolithically integrated with the planar base layer. A top surface of the block is configured as a die attach pad. The planar base layer has a base vertical thickness from the top surface of the ceramic tile to a top surface of the planar base layer. The block and the planar base layer have a combined vertical thickness from the top surface of the ceramic tile to a top surface of the block that is greater than the base vertical thickness.

21 Claims, 9 Drawing Sheets

(51) Int. Cl.
*H01L 23/367* (2006.01)
*H01L 23/373* (2006.01)
*H01L 25/07* (2006.01)
*H01L 25/18* (2023.01)

(52) U.S. Cl.
CPC .............. *H01L 24/30* (2013.01); *H01L 24/32* (2013.01); *H01L 24/33* (2013.01); *H01L 23/3735* (2013.01); *H01L 25/072* (2013.01); *H01L 25/18* (2013.01); *H01L 2224/29111* (2013.01); *H01L 2224/2912* (2013.01); *H01L 2224/29139* (2013.01); *H01L 2224/29147* (2013.01); *H01L 2224/30505* (2013.01); *H01L 2224/32227* (2013.01); *H01L 2224/32238* (2013.01); *H01L 2224/33181* (2013.01); *H01L 2924/0132* (2013.01); *H01L 2924/0133* (2013.01); *H01L 2924/15153* (2013.01); *H01L 2924/15159* (2013.01); *H01L 2924/1517* (2013.01)

(58) Field of Classification Search
CPC ... H01L 2924/0133; H01L 2924/15153; H01L 2924/15159; H01L 2924/1517; H01L 23/15
See application file for complete search history.

(56) References Cited

U.S. PATENT DOCUMENTS

| | | | |
|---|---|---|---|
| 2011/0037166 A1* | 2/2011 | Ikeda | H01L 24/73 257/E23.101 |
| 2011/0267789 A1* | 11/2011 | Chew | H01L 21/4832 361/767 |
| 2014/0327127 A1 | 11/2014 | Hable et al. | |
| 2016/0126157 A1 | 5/2016 | Jeon | |
| 2018/0102303 A1* | 4/2018 | Mori | B32B 7/04 |
| 2021/0217724 A1* | 7/2021 | Matsui | H01L 25/50 |
| 2023/0023410 A1* | 1/2023 | Baruch | B25H 3/021 |
| 2023/0023610 A1* | 1/2023 | Lee | H05K 7/20 |

* cited by examiner

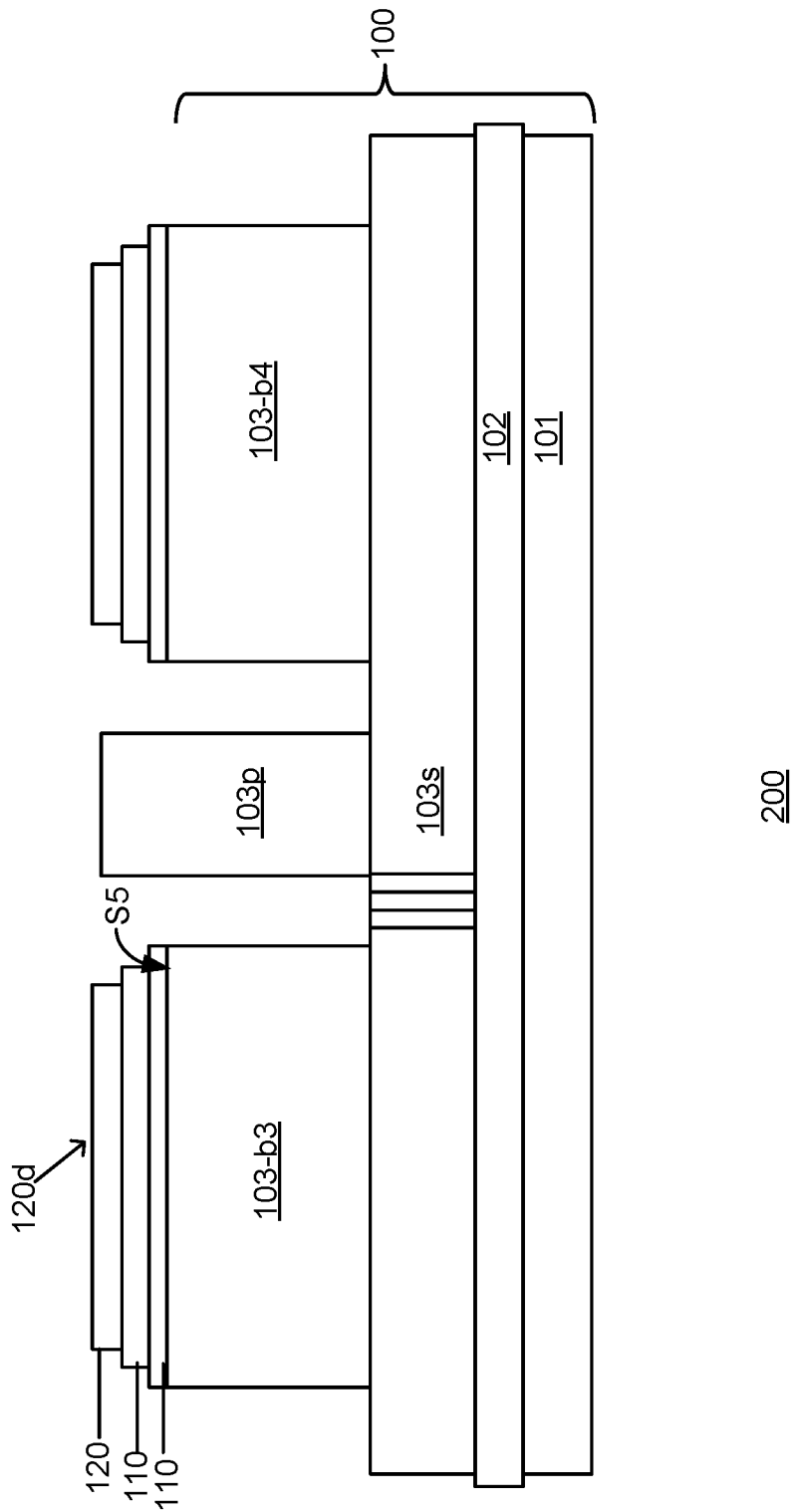

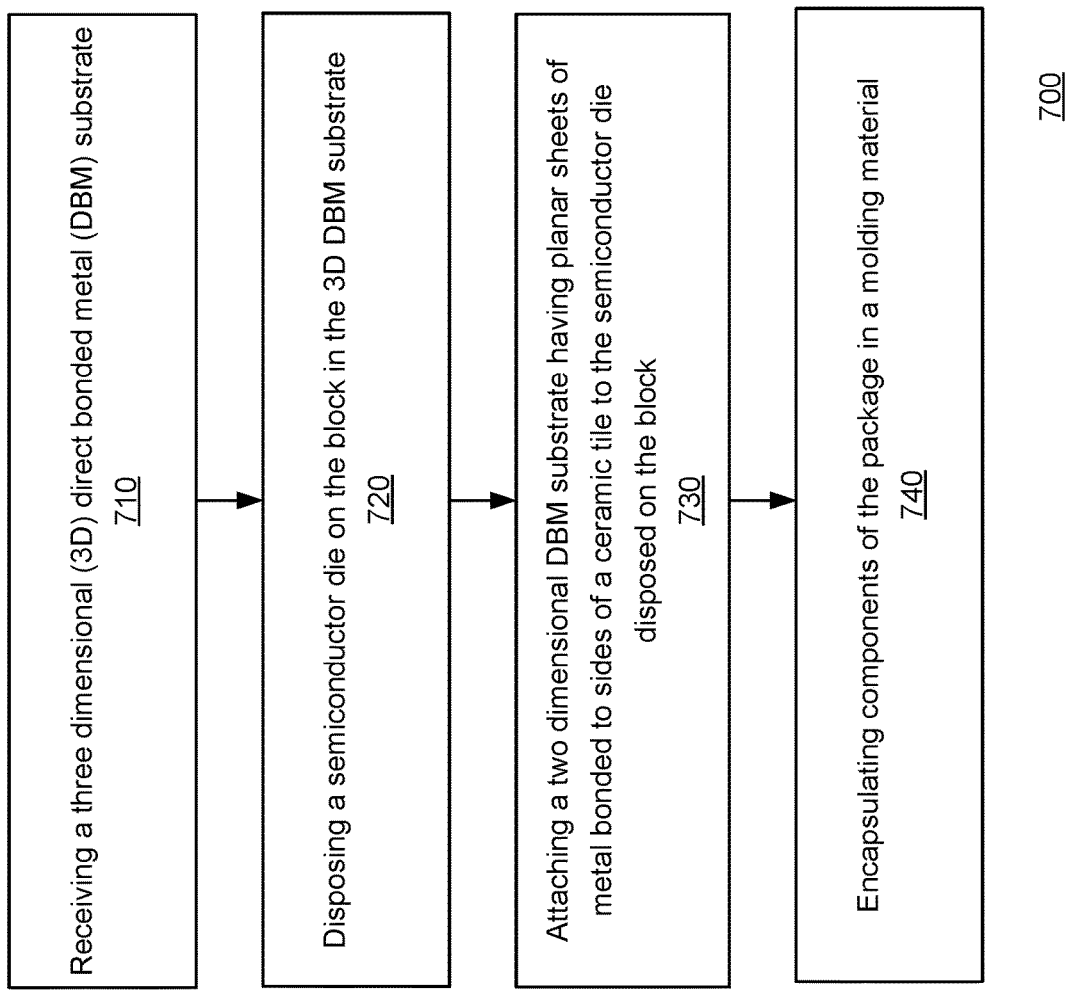

DUAL SIDE COOLED POWER MODULE WITH THREE-DIMENSIONAL DIRECT BONDED METAL SUBSTRATES

TECHNICAL FIELD

This description relates to packaging of semiconductor die in high power device packages.

BACKGROUND

Modern high-power devices (e.g., power devices such as an insulated-gate bipolar transistor (IGBT), a fast recovery diode (FRD), etc.) are fabricated in semiconductor die. High-power devices that can deliver or switch high levels of power can be used in, for example, vehicles powered by electricity (e.g., Electric vehicles (EVs), hybrid electric vehicles (HEVs) and plug-in-electric vehicles (PHEV)). The power devices can be fabricated in semiconductor die. The high-power devices may be packaged in single-side cooling (SSC) or dual-side cooling (DSC) power modules. Semiconductor die can be encapsulated in a supporting material that prevents physical damage and corrosion during a packaging process.

SUMMARY

In a general aspect, a substrate includes a ceramic tile and a three-dimensional (3D) conductive structure.

In an aspect, the 3D conductive structure includes a planar base layer having a bottom surface bonded to a top surface of the ceramic tile, and a block disposed above the planar base layer. The block is monolithically integrated with the planar base layer. A top surface of the block is configured as a die attach pad. The planar base layer has a base vertical thickness from the top surface of the ceramic tile to a top surface of the planar base layer. The block and the planar base layer have a combined vertical thickness from the top surface of the ceramic tile to a top surface of the block that is greater than the base vertical thickness.

In another aspect, the 3D conductive structure includes a planar base layer having a bottom surface bonded to a top surface of the ceramic tile. The planar base layer has a vertical base thickness between the top surface of the ceramic tile and a top surface of the planar base layer. The 3D conductive structure further includes a block monolithically integrated with and above the planar base layer, the block having a vertical block thickness from the top surface of the planar base layer to a top surface of the block. The top surface of the block is configured as a die attach pad.

In a general aspect, a package includes a first direct bonded metal (DBM) substrate. The first DBM substrate includes a planar base layer having a bottom surface bonded to a top surface of a ceramic tile. The planar base layer has a vertical base thickness from the top surface of the ceramic tile to a top surface of the planar base layer. The first DBM substrate further includes a block monolithically integrated with and above the planar base layer. The block has a vertical block thickness from the top surface of the planar base layer to a top surface of the block. The top surface of the block is configured as a die attach pad.

The package further included a semiconductor die disposed on the die attach pad; and a second DBM substrate disposed on a top of the semiconductor die.

The details of one or more implementations are set forth in the accompanying drawings and the description below.

Other features will be apparent from the description and drawings, and from the claims.

BRIEF DESCRIPTION OF THE DRAWINGS

FIGS. 2A and 2B illustrate an example assembly of semiconductor die and a 3D DBM substrate.

FIG. 7 illustrates an example method for packaging semiconductor die in a dual side cooled power device package.

DETAILED DESCRIPTION

Figure 1A:
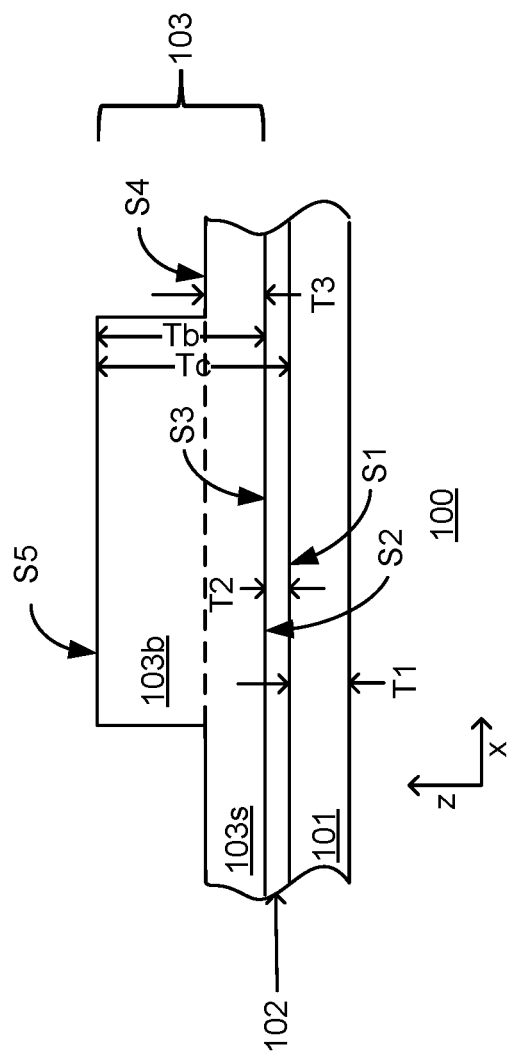
FIGS. 1A and 1B illustrate a cross sectional view an example three-dimensional (3D) direct bonded metal (DBM) substrate.

Semiconductor die can be packaged in a power module for use, for example, in automotive applications. In a power module, the semiconductor die can be mechanically attached or bonded to a direct bonded metal (DBM) (e.g., direct-bonded copper (DBC)) substrate. The DBM substrate can include an insulating dielectric layer (e.g., a ceramic tile) disposed between two metal layers. The DBM substrates described herein have a three-dimensional (3D) conductive structure bonded to a side of a ceramic tile.

A 3D DBM substrate, used in power modules as described herein, can be composed of a ceramic tile (e.g., alumina ($Al_2O_3$), zirconia-toughened-alumina (ZTA), aluminum nitride (AlN), beryllium (BeO), etc.) with a planar sheet of metal (e.g., copper) bonded to one or both sides of the ceramic tile. One or more of the metal layers can be patterned and/or can be used for electrical traces or contacts. For example, device contact pads on the semiconductor die can be coupled (e.g., bonded) to a corresponding conductive metal trace pattern (e.g., printed circuit traces) on a side of the DBM substrate using, for example, adhesive joints (e.g., solder balls, solder pads, sintered material, etc.). The adhesive joints provide continuity of electrical and thermal flow paths from device contacts (e.g., device terminals) on the semiconductor die through the conductive metal trace pattern of the DBM substrate. Each adhesive joint may, for example, provide an electrical connection for a respective specific 110 function of the semiconductor die. Mechanical and structural integrity of the adhesive joints can be important for proper electrical functioning of the power module.

The 3D DBM substrates described herein can be used in a power device package that can be a package for connecting the semiconductor die to the external environment via leads such as lands, balls, or pins. The package may provide protection against threats such as mechanical impact, chemical contamination, and light exposure. Additionally, the package may help dissipate heat produced by the semiconductor die.

The 3D DBM substrates described herein can be used in multi-chip module (MCM) device packages that can include multiple semiconductor die (e.g., an IGBT die, a FRD die) that are integrated so that, in use, the MCM device package can be treated as if it were a single component. Each of the multiple semiconductor die may be bonded (e.g., soldered) to a conductive spacer block (e.g., a copper block) to form a vertical stack. In a dual side cooled power module, multiple vertical stacks (having approximately a same height) can be disposed between two (horizontal) DBM substrates (e.g., a first (bottom) substrate and a second (top) substrate). The enclosed components may be positioned to conduct heat to (in other words, be thermally coupled (e.g., bonded) to) one or both of the horizontal 3D DBM substrates. For example, the semiconductor die in each vertical stack may be bonded (e.g., soldered) to one of the substrates (e.g., the top substrate or the bottom substrate), and the spacer block in the vertical stack may be bonded (e.g., soldered) to the other one of the two substrates (e.g., the bottom substrate or the top substrate). The components of the package are encapsulated in a molding material (e.g., an epoxy molding compound (EMC)).

Each dual side cooled power device package configured with a vertical semiconductor die-spacer block stack may include three distinct solder layers (e.g., a first solder layer between the die and the bottom DBM substrate, a second solder layer between the die and the spacer block, and a third solder layer between the spacer block and the top DBM substrate).

The semiconductor die may include power devices (e.g., silicon semiconductor die, silicon carbide (SiC) semiconductor die, insulated-gate bipolar transistors (IGBTs), metal-oxide-semiconductor field effect transistor (MOSFET) die, fast recovery diodes (FRD), etc.) that are assembled in device packages (e.g., a double sided direct cooled power device package) to benefit from dual side cooling, which may be provided using the pair of opposing substrates.

Like the semiconductor die for the modern high-power devices (e.g., insulated gate bipolar transistors (IGBTs), fast recovery diodes (FRD), etc.), modern power device packages have increasingly large areas and decreasing thicknesses.

Use of the disclosed 3D DBM substrates in a package may reduce a number of components with different coefficient of thermal expansion (CTE) in the package and reduce a number of solder joints needed between components in the package. These reductions can reduce a risk of thermally-induced flexing, bending or warpage (warpage) of the components of the package.

Differences or mismatches in the coefficient of thermal expansion (CTE) (i.e., CTE mismatches) of the materials of the components (semiconductor die, spacer blocks, solder layers, EMC, etc.) can result in, for example, thermally-induced flexing, bending or warpage (warpage) of the components of the package. This thermally-induced warpage can have a deleterious effect, for example, on the mechanical and structural integrity of the solder joints between the semiconductor die and the DBM substrate and/or degrade the electrical and thermal flow paths from the device contacts. This can consequently affect the electrical functioning and/or reliability of the power device package. The effects of the thermally-induced warpage may be more pronounced moving from a center toward an edge of the semiconductor die in the power device package, and may be more pronounced for solder joints to small-area device contacts (e.g., signal sense contact pads) than for solder joints to large-area device contacts (e.g., emitter contact pads). For example, a CTE mismatch between components in a vertical direction (e.g., between the spacer blocks and the EMC) or a CTE mismatch between components in a horizontal direction (e.g., between the top DBM substrate and spacer block) can cause delamination or peeling stress near the signal sense contact pads of an IGBT die. Cracks may form around signal pads of the IGBT die in the device package.

A traditional DBM substrate that has only planar sheets of metal bonded to both sides of a ceramic tile may be referred to herein as a two-dimensional (2D) DBM substrate.

A DBM substrate having a three-dimensional (3D) conductive structure bonded to a side of a ceramic tile is described herein. The three-dimensional conductive structure may be made of metal (e.g., copper) or metal alloy.

The disclosed DBM substrate (hereinafter 3D DBM substrate) can include a monolithic three-dimensional metal structure (e.g., including one or more monolithic blocks). A top surface of a block (e.g., a rectangular block) may be configured for use as a die attach pad to contact and/or support a semiconductor die in a power device package. The three-dimensional structure can also include a column-like or a pillar-like structure. In a power device package based on the disclosed DBM substrate, the three-dimensional structures (e.g., blocks, etc.) may have mechanical support and thermal conduction functions that may be the same as the mechanical support and thermal conduction functions of, for example, a spacer block in a three-solder layer power device package (incorporating a vertical stack of a semiconductor die coupled to a spacer block). However, in contrast to a three-solder layer power device package, as discussed below, assembly of a dual-side cooled power device package based on the disclosed DBM substrate may need or involve only two solder layers.

Figure 1B:
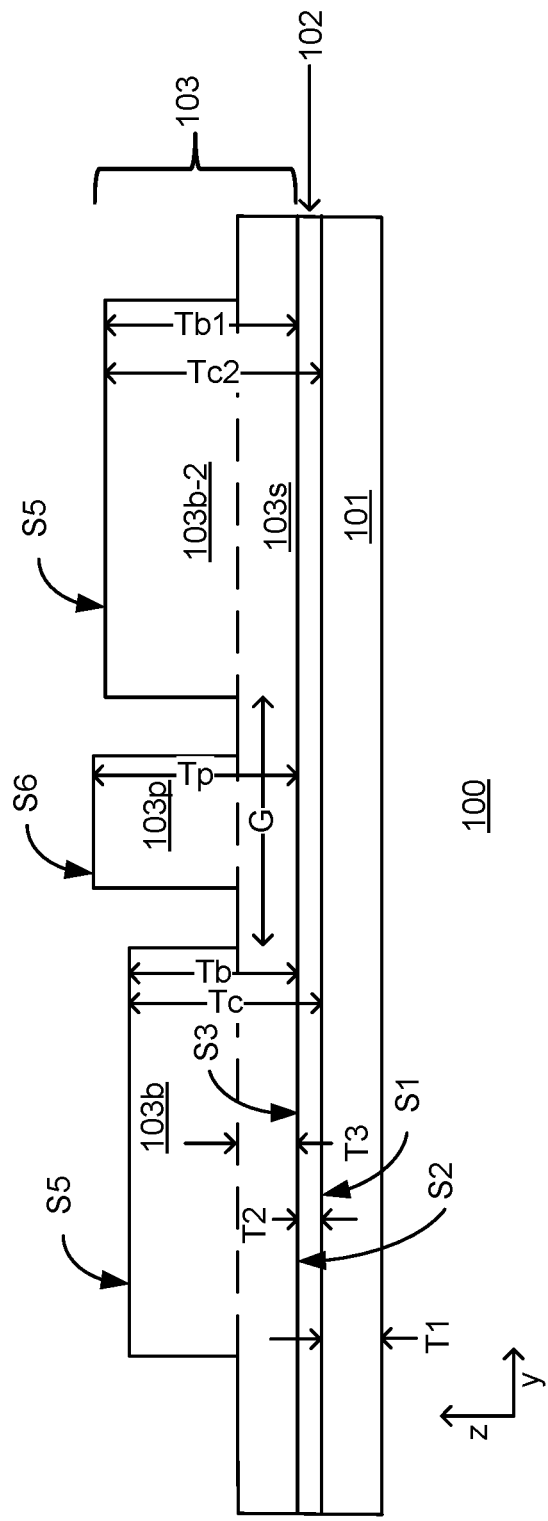

FIGS. 1A and 1B show, cross sectional views an example 3D DBM substrate 100 including three-dimensional conductive structures (e.g., three-dimensional structure 103), in accordance with the principles of the present disclosure.

As shown in FIGS. 1A and 1B, 3D DBM substrate 100 may include a ceramic tile 102 (e.g., alumina tile, ZAT tile, etc.) having a planar configuration (e.g., in an x-y plane). Ceramic tile 102 may have a bottom surface S1 on one side and a top surface S2 on the other side of the tile, and may have a vertical thickness T2 (in a z direction). In example implementations, thickness T2 may be in a range of 0.1 mm to 0.9 mm (e.g., 0.32 mm). A sheet of metal 101 (e.g., a sheet of copper) may be bonded to bottom surface S1 of ceramic tile 102. Sheet of metal 101 may have a vertical thickness T1 (in the z direction). In example implementations, thickness T1 may be in a range of 0.2 mm to 0.7 mm (e.g., 0.3 mm).

Further, a three-dimensional structure 103 made of conductive metal (e.g., copper) may be attached (i.e., bonded) to top surface S2 of ceramic tile 102. Three-dimensional structure 103 may include a planar base layer (e.g., base layer 103s) having a bottom surface S3 bonded to top surface S2 of the ceramic tile. Base layer 103s may be made of metal (e.g., copper) and may have a vertical base thickness T3 (in the z direction) from the top surface S2 of the ceramic tile to a top surface S4 of the planar base layer. Vertical base thickness T3 may be in a range of 0.2 mm to 0.7 mm (e.g., 0.3 mm).

Three-dimensional structure 103 may further include one or more blocks (e.g., blocks 103b) disposed on (above), and monolithically integrated with, base layer 103s. The monolithic integration can include a single piece that is solid or unbroken. The monolithic integration can include a single piece or component that is formed from a single block of material and is not formed from two separate components fused or coupled together.

FIG. 1A shows, for example, a block 103*b* monolithically integrated with, and above, planar base layer 103*s*. Block 103*b* may have a vertical block height or thickness Tb between top surface S2 of the ceramic tile and a top surface S5 of the block. In three-dimensional structure 103, the monolithically integrated block 103*b* and the planar base layer 103*s* may have a combined vertical thickness Tc (=Tb+T2) that is greater than the base vertical thickness T3. An example 3D DBM substrate 100 may have thicknesses: T1 between 0.2 and 0.4 mm (e.g., 0.3 mm); T2 between 0.2 mm and mm (e.g., 0.3 mm); T3 between 0.1 mm and 0.4 mm (e.g., 0.2 mm); Tb between 0.4 mm and 0.9 mm (e.g., 0.5 mm); and Tc between 0.6 mm and 1.3 mm (e.g., 0.8 mm).

Top surface S5 of block 103*b* may be a surface generally parallel to the x-y plane of the ceramic tile. Top surface S5 may be configured to receive and attach a semiconductor die for a package assembly. In other words, top surface S5 may be configured to be a die attach pad (DAP) for the package assembly. In example implementations, top surface S5 of block 103*b* may be a solderable (or sinter-able) surface.

As noted previously, three-dimensional structure 103 may further include more than one block (e.g., blocks 103*b*) disposed on (above), and monolithically integrated with, base layer 103*s*.

FIG. 1B shows, for example, substrate 100 with two blocks (i.e., a first block 103*b*, and a second block 103*b*-2) disposed on (above), and monolithically integrated with, base layer 103*s*. The two blocks (e.g., block 103*b*, and block 103*b*-2) may be disposed on planar base layer with a separation distance or gap G between the two blocks.

The two blocks (e.g., block 103*b*, and block 103*b*-2) may have the same or different vertical heights between top surface S2 of the ceramic tile and top surfaces S5 of the blocks. In FIG. 1B, the vertical block heights or thicknesses of the two blocks between top surface S2 of the ceramic tile and top surfaces S5 of the blocks are labelled as Tb and Tb2, respectively, and the combined vertical thicknesses of the blocks (i.e., a first combined vertical thickness, and a second combined vertical thickness) between top surface S2 of the ceramic tile and top surfaces S5 of the blocks are labelled as Tc and Tc2, respectively, in FIG. 1B. Top surfaces S5 of the first and second blocks may be configured as a first die attach pad and a second die attach pad, respectively.

In example implementations, the two blocks (e.g., block 103*b*, and block 103*b*-2) may have about a same vertical block height or thickness (i.e., Tb Tb2). Further, the two blocks (e.g., block 103*b*, and block 103*b*-2) may have about a same combined vertical height or thickness (i.e., Tc Tc2). In some example implementations, the two blocks may have different vertical block heights (e.g., with Tb2 being greater than Tb) and or different combined vertical heights (e.g., with Tc2 being greater than Tc) as shown in FIG. 1B).

In example implementations, three-dimensional structure 103 may also include one or more column or pillar shape structures (e.g., vertical connector 103*p*) disposed on, and monolithically integrated with, base layer 103*s*. As shown in FIG. 1B, vertical connector 103*p* may have a vertical height or thickness Tp between top surface S2 of the ceramic tile and a top surface S6 of the vertical connector. Vertical connector 103*p* may be configured to mechanically support and electrically connect to, for example, a top DBM substrate (e.g., substrate 190, FIG. 5)) at a vertical height Tp above 3D DBM substrate 100 in a dual side cooled device package.

Three-dimensional structure 103 including base layer 103*s*, blocks 103*b*, and vertical connectors 103*p* may be a monolithic structure formed, for example, by lithographically patterning and etching a metal plate. In processes for fabricating 3D DBM substrate 100, the metal plate may be bonded to surface S2 of ceramic tile 102 before, or after, the etching steps that form, for example, blocks 103*b* and vertical connectors 103*p*. Blocks 103*b* may include blocks of different sizes (e.g., blocks 103*b*-3 and 103*b*-4, FIG. 2) corresponding, for example, to the different sized semiconductor die that may be bonded to the blocks (e.g., in a device package).

Figure 2A:
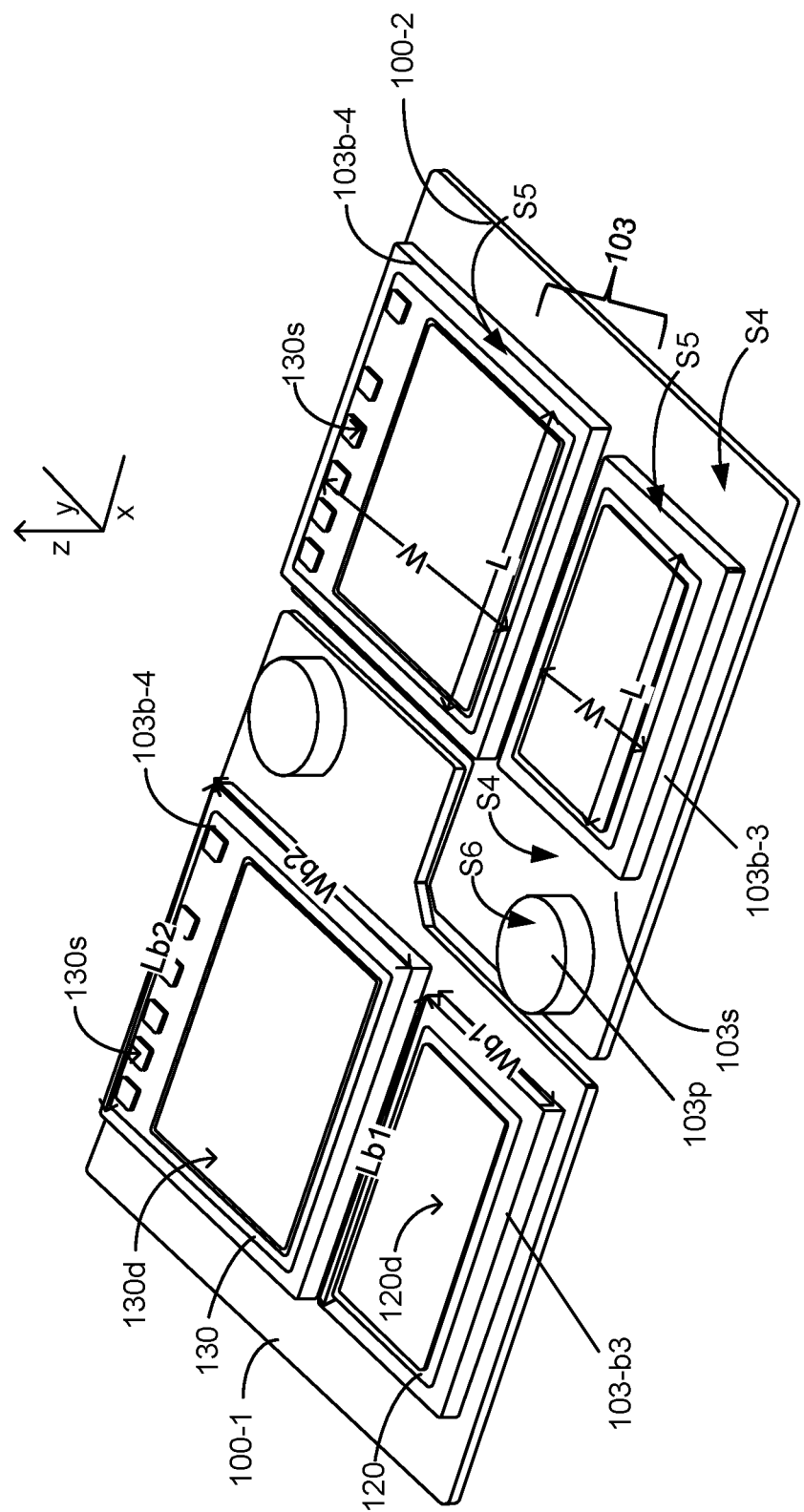

FIG. 2A shows, for example, in a perspective view, an assembly 200 of semiconductor die and 3D DBM substrate 100. FIG. 2B shows a cross-sectional view of assembly 200 of semiconductor die (e.g., semiconductor die 120 and semiconductor die 130) and 3D DBM substrate 100. Assembly 200 includes two segments (i.e., segments 100-1 and 100-2) of 3D DBM substrate 100 each with blocks 103*b*-3 and 103*b*-4 of different sizes in the three-dimensional structure 103 of the substrate.

Semiconductor die (e.g., semiconductor die 120 and semiconductor die 130) may have a generally square or rectangular shape with, for example, a length L (in the x direction) and a width W (in the y direction) in a lateral plane (x-y plane). The dimensions of each side of the semiconductor die may be in a range of several millimeters. For example, W may be in a range of 5 to 20 millimeters, and L may be in a range of 10 to 20 millimeters.

In example implementations, block 103*b*-3 may have a length Lb1 (in the x direction) and a width Wb1 (in the y direction) in a lateral plane (x-y plane), and a vertical block height or thickness Tb (in the z direction). Block 103*b*-4 may have a length Lb2 (in the x direction), a width Wb2 (in the y direction) in the lateral plane (x-y plane), and a vertical block height or thickness Tb (in the z direction). Length Lb1, width Wb1, length Lb2, and width Wb2 may each be in a range of 10 to 20 millimeters, and vertical height or thickness Tb may be a range of 0.4 to 1 millimeter. Block 103*b*-3 may have a size (i.e., x-y dimensions) corresponding, for example, to a size of semiconductor die 120 (e.g., a FRD die), and block 103*b*-4 may have a size (i.e., x-y dimensions) corresponding, for example, to a size of semiconductor die 130 (e.g., an IGBT die).

In assembly 200, a backside of semiconductor die 120 (e.g., FRD die) may be attached to top surface S5 of block 103*b*-3 by an adhesive layer 110 (FIG. 2B). Adhesive layer 110 may, for example, be a solder layer. Further, a backside of semiconductor die 130 (e.g., an IGBT die) may be attached to top surface S5 of block 103*b*-4 by adhesive layer 110 (FIG. 2B).

Semiconductor die 120 on a frontside may include a device contact pad (e.g., contact pad 120*d*) for contacting a diode portion of the FRD device. Semiconductor die 130 on a frontside may include a device contact pad (e.g., contact pad 130*d*) for contacting a transistor portion of the IGBT device, and one or more smaller device contact pads (e.g., signal sense contact pads 130*s*) for connecting signals (e.g., I/O signals) to the device.

As shown for example in FIGS. 2A and 2B, semiconductor die 120 may be attached to top surface S5 of block 103*b*-3, and semiconductor die 130 may be attached to top surface S5 of block 103*b*-4 so that the device contact pads (e.g., contact pad 120*d*, contact pad 130*d*, and signal sense contact pads 130*s*) on the frontside of the dies are facing upward (e.g., in the z direction) where they can be accessed, contacted, and connected (e.g., via a top DBM substrate or leads of a leadframe, etc.) to terminals of a device package. The contact pads (e.g., contact pad 120*d*, contact pad 130*d*, and signal sense contact pads 130*s*) may be connected to the terminals using an adhesive layer (e.g., adhesive layer 510, FIG. 5) deposited on the contact pads. Adhesive layer 510 may, for example, be a solder material layer or a sinterable material (e.g., silver) layer.

Figure 3:
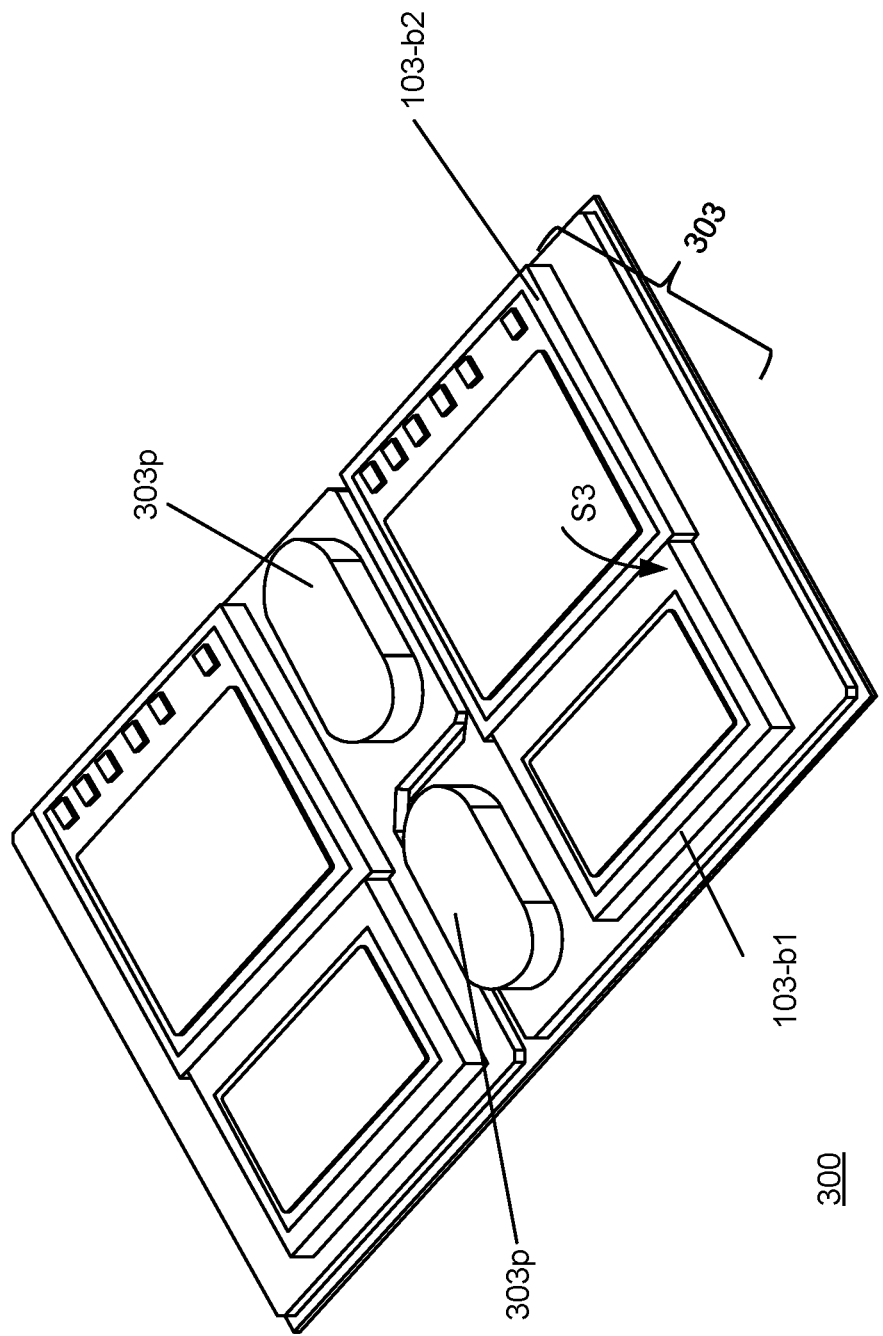
FIG. 3 illustrates an example DBM substrate with a three-dimensional structure in which vertical connectors have a rounded rectangular shape.

In the example 3D DBM substrate 100 shown in FIGS. 2A and 2B, vertical connectors 103p may have a circular cross-section (in the x-y plane). In other example implementations, vertical connectors 103p may have other cross-sectional shapes (e.g., oval, rectangular, rounded rectangle, square, hexagonal, etc.). FIG. 3 shows, for example, 3D DBM substrate 300 with a three-dimensional structure 303 in which vertical connectors 303p have a rounded rectangular shape.

In the example implementations of 3D DBM substrate 100 (FIGS. 1A, 1B, 2A and 2B) and 3D DBM substrate 300 (FIG. 3), top surfaces S5 of block 103b, block 103b-2, block 130b-3 and block 103b-4 (which function as die attach pads for respective semiconductor die) may be generally planar, as shown, for example, in FIGS. 1A, 1B, 2A, 2B, and 3. In some example implementations, top surfaces S5 may include a recess (pocket or cavity) configured to receive the respective semiconductor die for attachment.

Figure 4:
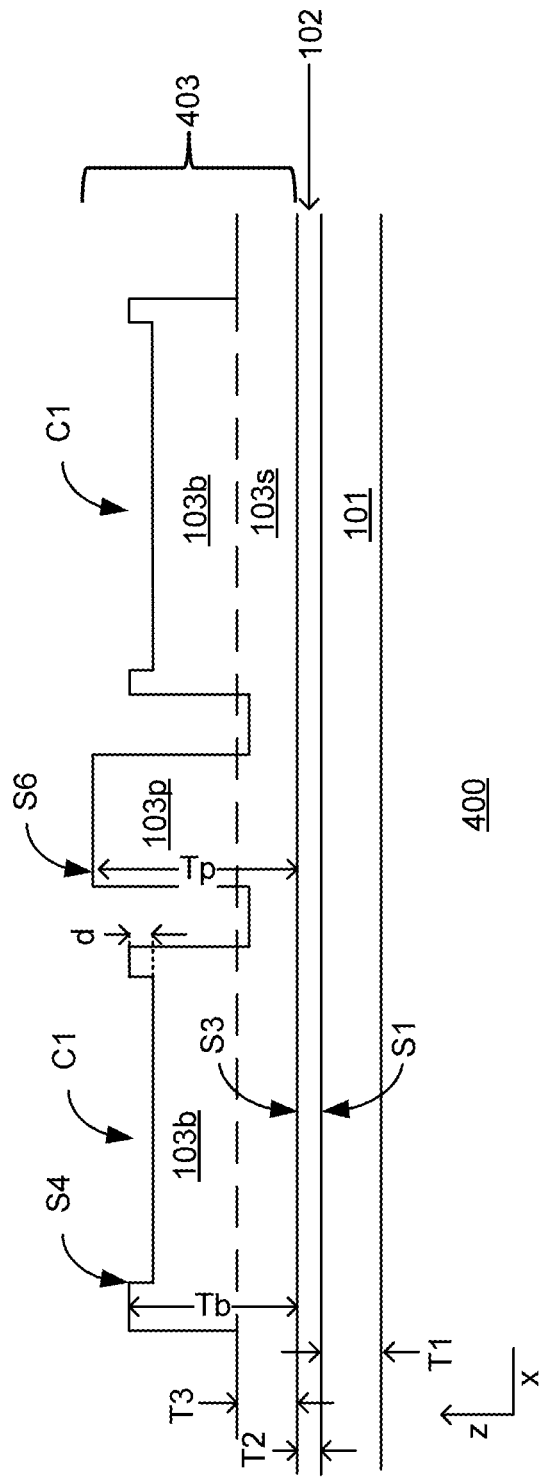
FIG. 4 illustrates an example 3D DBM substrate in which top surfaces of blocks include cavities configured to receive respective semiconductor die for attachment.

FIG. 4 shows, for example, a 3D DBM substrate 400 in which top surfaces S5 of blocks 103b include a cavity Cl configured to receive the respective semiconductor die for attachment. Cavity Cl may formed by recessing a portion of a top surface S5 of a block 103b by a depth d (in the z direction). Cavity Cl may be configured to align and hold the semiconductor die (e.g., semiconductor die 120, semiconductor die 130, FIG. 2A) in position on top surface S5 of block 103b.

Figure 5:
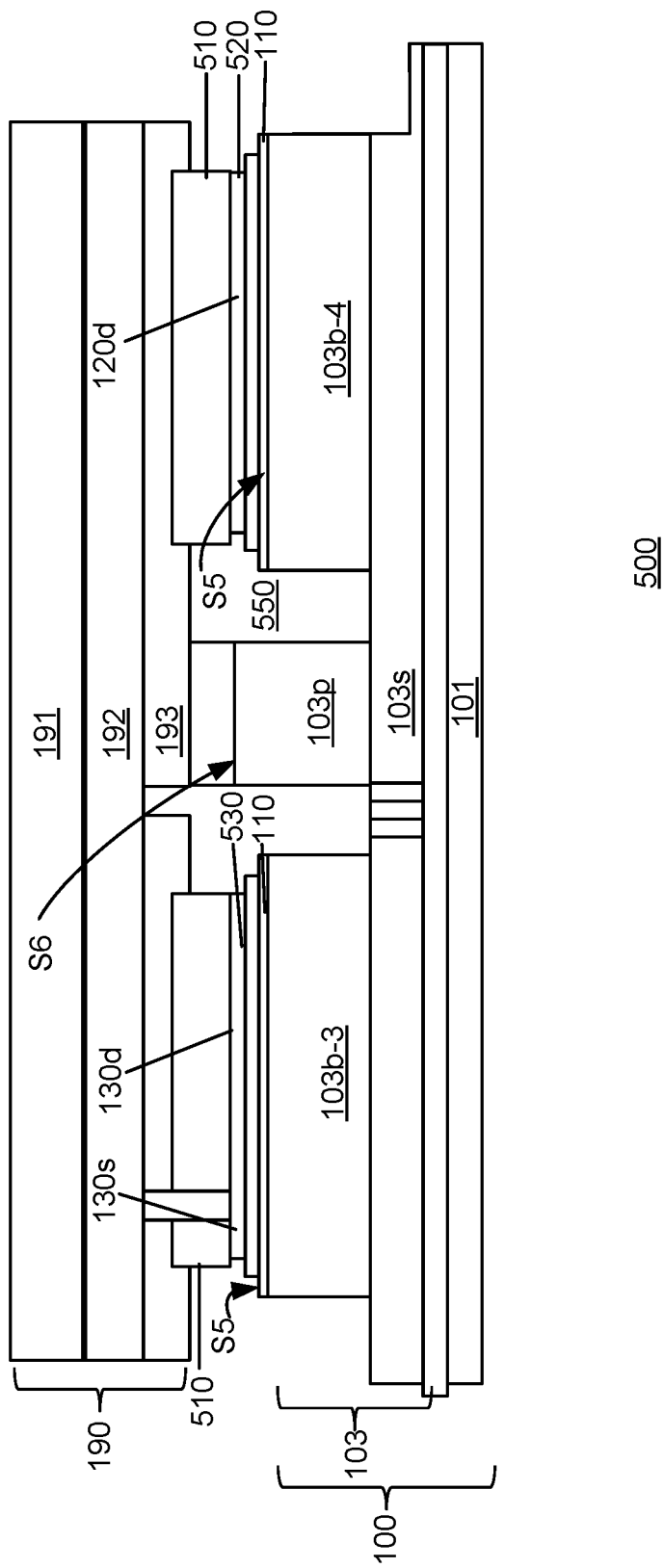
FIG. 5 illustrates a portion of an example dual side cooled power device package integrating semiconductor die and a 3D DBM substrate having a three-dimensional conductive structure.

FIG. 5 shows, in cross-sectional view, a portion of an example dual side cooled power device package 500 assembled utilizing a DBM substrate (e.g., 3D DBM substrate 100) having a three-dimensional conductive structure for integrating semiconductor die (e.g., semiconductor die 520 and 530) in the power device package.

Dual side cooled power device package 500 may include, for example, 3D DBM substrate 100 (FIG. 1) as a bottom substrate, and a 2D DBM substrate 190 as a top substrate of the package. 2D DBM substrate 190 may, for example, be a DBM substrate with planar metal layers 191 and 193 bonded to opposite sides of a ceramic tile 192. Metal layer 193 may, for example, be, or can include, a patterned copper layer with traces, lines, or paths for distribution of electrical currents and voltages.

Power device package 500 may, for example, be a multi-chip module (MCM) package including, for example, at least a pair of semiconductor die (e.g., a FRD, semiconductor die 520; and an IGBT, semiconductor die 530) disposed between the top and bottom substrates. Only two solder layers (i.e., adhesive layer 110 and adhesive layer 510) may be involved or required for electrically and thermally connecting the pair of semiconductor die to the top and bottom substrates of the dual side cooled power device package 500.

As shown in FIG. 5, in power device package 500, semiconductor die 520 and 530 are attached (i.e., soldered or sintered) to the bottom substrate (i.e., 3D DBM substrate 100) by a first solder layer (e.g., adhesive layer 110). Adhesive layer 110 may be disposed between the dies and surface S3 of block 103-1 and surface S3 of block 103-2. Further, semiconductor die 520 and 530 are attached (i.e., soldered) to the top substrate (i.e., 2D DBM substrate 190) by a second solder layer (e.g., adhesive layer 510). Adhesive layer 510 may be disposed between die contact pads (e.g., contact pad 120d on semiconductor die 520, and contact pad 130d and signal contact pad 130s on semiconductor die 530) and patterned metal layer 193 of 2D DBM substrate 190).

Further, in power device package 500, the top and bottom substrates (i.e., 2D DBM substrate 190, and 3D DBM substrate 100) are connected by soldering surface S6 of vertical connector 103p of 3D DBM substrate 100 to 2D DBM substrate 190 (e.g., using solder layer 510).

A molding material 550 (e.g., an EMC) may encapsulate the components of power device package 500 disposed between 3D DBM substrate 100 and 2D DBM substrate 190.

Example device and circuit modules (such as inverters for industrial applications) can incorporate a wide variety of components, including insulated-gate bipolar transistor (IGBT) power devices, power modules, high-voltage DC line capacitors, main circuit bus bars, a power module drive circuit board, a motor control circuit board, three-phase current sensors, and DC and heavy-current AC connectors, etc.

Figure 6:
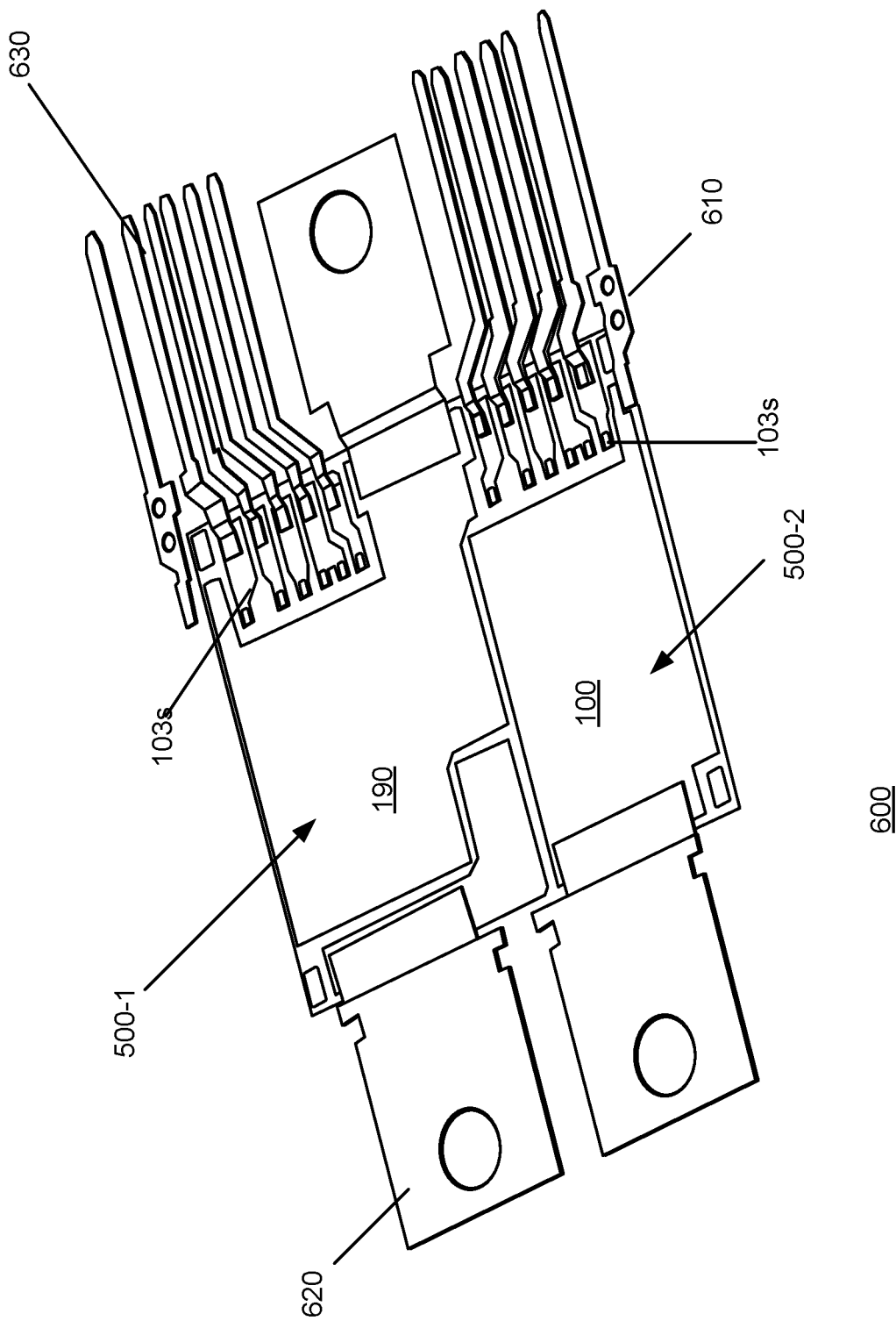
FIG. 6 illustrates an example circuit module that includes power device packages with dual side cooling.

FIG. 6 illustrates a perspective view of an example circuit module 600 that includes power device packages with dual side cooling.

Circuit module 600 is illustrated with some components being partially transparent so that some of the components disposed therein may be visible. Circuit module 600 may include a leadframe 610 (e.g., a mounting frame), which includes bolt connectors 620 and external electrical connection leads 630. In example implementations, leadframe 610 may be coupled to a pair of power device packages 500-1 and 500-2 corresponding, for example, to a high-side circuit and a low-side circuit. Each of power device packages 500-1 and 500-2 may be a dual side cooled device package (like package 500, FIG. 5) and may include power devices (e.g., a FRD, semiconductor die 520; and an IGBT, semiconductor die 530) disposed between 3D DBM substrate (e.g., substrate 100) and 2D DBM substrate (e.g., substrate 190). In some implementations, signal sense contact pads (e.g., contact pads 130s, FIG. 2A) of the semiconductor die may be connected to (i.e., bonded to) individual external electrical connection leads 630.

FIG. 7 shows an example method 700 for packaging semiconductor die in a dual side cooled power device package, in accordance with the principles of the present disclosure.

Method 700 may include receiving a three-dimensional (3D) direct bonded metal (DBM) substrate (710). The 3D DBM substrate may include a ceramic tile (e.g., alumina, ZAT) in a planar x-y configuration. The ceramic tile may have sides S1 and S2 and may have a thickness T2 (in a z direction). A sheet of metal (e.g., copper) may be bonded to side S1 of the ceramic tile. A 3D structure made of conductive metal (e.g., copper) may be bonded to side S2 of the ceramic tile. The 3D structure may include a planar base layer having a thickness T3 (in the z direction) and may further include a block disposed on the base layer. The block may have a height or thickness Tb (in the z direction) above the base layer and may have a top surface S5 configured as a die attach pad. In example implementations, the 3D structure may also include column-like or a pillar-like structures (e.g., a vertical connector) disposed on the base layer. A vertical connector may have a height or thickness of Tp (in the z direction) above the ceramic tile and may have a top surface S4.

Method 700 may further include disposing a semiconductor die on the block in the 3D DBM substrate (720), and attaching a two dimensional DBM substrate having planar sheets of metal bonded to sides of a ceramic tile to the semiconductor die disposed on the block (730). The 2D DBM substrate may be attached to contact pads disposed on a top of the semiconductor die disposed on the block.

Disposing the semiconductor die on the block in the 3D DBM substrate 720 may include disposing the semiconductor die on the top surface S5 of the block and using a first adhesive layer to attach the semiconductor die to the top surface S3 of the block. In an example implementation, the first adhesive layer may, for example, be a solder layer (e.g., a lead-free solder such as a tin-antimony alloy (Sn-5Sb)). Using the first adhesive layer to attach the semiconductor die to the top surface S3 of the block may further include reflowing the solder layer at a first reflow temperature of about 210° C. to 290° C. degrees (e.g., 270° C.).

Attaching another DBM substrate to contact pads on the top of the semiconductor die 730 may include using a second adhesive layer to attach the another DBM substrate to the contact pads on the top of the semiconductor die. In an example implementation, the second adhesive layer may, for example, be a solder layer (e.g., a lead-free alloy such as a tin-silver-copper alloy (SAC305)). Using the second adhesive layer to attach the another DBM substrate to contact pads on the top of the semiconductor die may include reflowing the second adhesive layer at a second reflow temperature less than the first reflow temperature. In an example implementation, the first reflow temperature may be of about 270° C. and second reflow temperature may be in the range of about 210° C. to 250° C. degrees (e.g., 220° C.).

In example implementations, attaching another DBM substrate to contact pads on the top of the semiconductor die 730 may include attaching the another DBM to top surface S4 of a vertical connector in the 3D DBM substrate.

Method 700 may further include encapsulating components of the package in a molding material (740).

In example implementations, a method involves receiving a three-dimensional (3D) direct bonded metal (DBM) substrate including:
- a planar base layer having a bottom surface bonded to a top surface of a ceramic tile, the planar base layer having a vertical base thickness from the top surface of the ceramic tile to a top surface of the planar base layer, and
- a block monolithically integrated with and above the planar base layer, the block having a vertical block thickness from the top surface of the planar base layer to a top surface of the block, the top surface of the block being configured as a die attach pad.

The method further includes disposing a semiconductor die on the die attach pad, and attaching a two-dimensional (2D) DBM substrate having a planar sheet of metal bonded to a side of a ceramic tile to the semiconductor die disposed on the block.

In the method, disposing the semiconductor die on the block in the 3D DBM substrate includes using a first adhesive layer to attach the semiconductor die to the top surface of the block. The first adhesive layer can be a lead-free tin-antimony alloy solder having a reflow temperature in a range of about 210° C. to 270° C.

In the method, attaching the 2D DBM substrate to the semiconductor die disposed on the block includes using a second adhesive layer to attach the 2D DBM substrate to contact pads on the semiconductor die. The second adhesive layer can be a lead-free tin-antimony alloy solder having a reflow temperature in a range of about 210° C. to 250° C.

In the method, receiving a three-dimensional (3D) direct bonded metal (DBM) substrate can include receiving the 3D DBM substrate having a pillar shape structure monolithically integrated with and above the planar base layer, and attaching the 2D DBM substrate to the semiconductor die can include attaching the 2D DBM substrate to a top surface of pillar shape structure.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A substrate comprising:
  a ceramic tile; and
  a three-dimensional conductive structure including:
  a planar base layer having a bottom surface bonded to a top surface of the ceramic tile, the planar base layer having a base vertical thickness from the top surface of the ceramic tile to a top surface of the planar base layer,
  a block disposed above the planar base layer and integrated with the planar base layer without an intervening joint, the block and the planar base layer having a first combined vertical thickness from the top surface of the ceramic tile to a top surface of the block, the first combined vertical thickness being greater than the base vertical thickness, the top surface of the block being configured as a die attach pad; and
a pillar disposed above the planar base layer and integrated with the planar base layer without an intervening joint, the pillar and the planar base layer having a second combined vertical thickness from the top surface of the ceramic tile to a top surface of the pillar, the second combined vertical thickness being greater than the first combined vertical thickness.

2. The substrate of claim 1, wherein the block is a first block, the die attach pad being a first die attach pad, and
the three-dimensional conductive structure including:
a second block disposed above the planar base layer and integrated with the planar base layer without an intervening joint, the second block being separated from the first block by a gap, the second block and the planar base layer having the first combined vertical thickness, a top surface of the second block being configured as a second die attach pad.

3. The substrate of claim 1, wherein the block is a first block and the die attach pad is a first die attach pad, the combined vertical thickness being a first combined vertical thickness, and wherein the three-dimensional conductive structure includes:
a second block disposed above the planar base layer and integrated with the planar base layer without an intervening joint, the second block being separated from the first block by a gap, the second block and the planar base layer having a third combined vertical thickness different than the first combined vertical thickness, the top surface of the second block being configured as a second die attach pad.

4. The substrate of claim 1, wherein a portion of the top surface of block configured as a die attach pad includes a recessed cavity configured to hold a semiconductor die in position on the block.

5. The substrate of claim 1, wherein the vertical base thickness between the top surface of the ceramic tile and the top surface of the planar base layer is less than 0.4 mm.

6. The substrate of claim 1, wherein the first combined vertical thickness from the top surface of the ceramic tile to the top surface of the block is at least 0.6 mm.

7. The substrate of claim 1, wherein the block has a length and a width in a lateral plane, the length and the width each being greater than 0.2 mm long.

8. The substrate of claim 1, wherein the three-dimensional conductive structure is a metal or metal alloy structure bonded to the ceramic tile.

9. The substrate of claim 1, wherein the block is a first block that is separated from the pillar by a first gap, the three-dimensional conductive structure including:
a second block disposed above the planar base layer and integrated with the planar base layer without any intervening joint, the second block being separated from the pillar by a second gap, the first gap and second gap being on opposite sides of the pillar, the second block and the planar base layer having the first combined vertical thickness, a top surface of the second block being configured as a second die attach pad.

10. A substrate comprising:
a ceramic tile; and
a three-dimensional conductive structure including:
a planar base layer having a bottom surface bonded to a top surface of the ceramic tile, the planar base layer having a vertical base thickness between the top surface of the ceramic tile and a top surface of the planar base layer,
a block disposed above the planar base layer and integrated with the planar base layer without an intervening joint, the block having a vertical block thickness from the top surface of the planar base layer to a top surface of the block, the top surface of the block being configured as a die attach pad,
a pillar disposed above the planar base layer and integrated with the planar base layer without an intervening joint, the pillar having a vertical pillar thickness from the top surface of the planar base layer to a top surface of the pillar, the vertical pillar thickness being greater than the vertical block thickness.

11. The substrate of claim 10, wherein the block is a first block and the die attach pad is a first die attach pad,
the three-dimensional conductive structure including:
a second block disposed above the planar base layer and integrated with the planar base layer without any intervening joint, the second block being separated from the first block by a gap, the second block and the planar base layer having a combined vertical thickness, the top surface of the second block being configured as a second die attach pad.

12. The substrate of claim 10, wherein the block is a first block, the die attach pad is a first die attach pad, and the vertical block thickness is a first vertical block thickness,
the three-dimensional conductive structure including:
a second block disposed above the planar base layer and integrated with the planar base layer without any intervening joint, the second block being separated from the first block by a gap, the second block and the planar base layer having a second vertical block thickness different than the first vertical block thickness, the top surface of the second block being configured as a second die attach pad.

13. The substrate of claim 10, wherein a portion of the top surface of block configured as a die attach pad includes a recessed cavity configured to hold a semiconductor die in position on the block.

14. A package comprising:
a first direct bonded metal (DBM) substrate including:
a planar base layer having a bottom surface bonded to a top surface of a ceramic tile, the planar base layer having a vertical base thickness from the top surface of the ceramic tile to a top surface of the planar base layer,
a block disposed above the planar base layer and integrated with the planar base layer without any intervening joint, the block having a vertical block thickness from the top surface of the planar base layer to a top surface of the block, the top surface of the block being configured as a die attach pad, and
a pillar disposed above the planar base layer and integrated with the planar base layer without an intervening joint, the pillar having a vertical pillar thickness from the top surface of the planar base layer to a top surface of the pillar, the vertical pillar thickness being greater than the vertical block thickness;
a semiconductor die disposed on the die attach pad; and
a second DBM substrate disposed on a top of the semiconductor die.

15. The package of claim 14, wherein a portion of the top surface of block configured as the die attach pad includes a recessed cavity configured to hold a semiconductor die in position on the block.

16. The package of claim 14, wherein a first solder layer bonds the semiconductor die to the die attach pad.

17. The package of claim 16, wherein the first solder layer is a lead-free tin-antimony alloy.

18. The package of claim 14, wherein a second solder layer bonds the second substrate to the semiconductor die.

19. The package of claim 18, wherein the second solder layer is a lead-free tin-silver-copper alloy.

20. The package of claim 14, wherein a top surface of the pillar is bonded to the second DBM substrate disposed on the top of the semiconductor die.

21. The package of claim 14, wherein the block is a first block that is separated from the pillar by a first gap, the first DBM substrate including:
  a second block disposed above the planar base layer and integrated with the planar base layer without any intervening joint, the second block being separated from the pillar by a second gap, the first gap and second gap being on opposite sides of the pillar, the second block and the planar base layer having the first combined vertical thickness, a top surface of the second block being configured as a second die attach pad.

* * * * *